United States Patent [19]
Bertness et al.

[11] Patent Number: 6,081,098
[45] Date of Patent: *Jun. 27, 2000

[54] METHOD AND APPARATUS FOR CHARGING A BATTERY

[75] Inventors: Kevin I. Bertness, Batavia; Stephen J. McShane, Oak Brook, both of Ill.

[73] Assignee: Midtronics, Inc., Burr Ridge, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/962,754

[22] Filed: Nov. 3, 1997

[51] Int. Cl.$^7$ .................................................. H02J 7/00
[52] U.S. Cl. ......................... 320/134; 320/136; 320/160; 320/162
[58] Field of Search .................... 320/136, 162, 320/160, 134

[56] References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/430 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 429/431 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |

(List continued on next page.)

FOREIGN PATENT DOCUMENTS

| | | |
|---|---|---|
| 0 022 450 A1 | 1/1981 | European Pat. Off. . |
| 0 637 754 A1 | 2/1995 | European Pat. Off. . |
| 0 772 056 A1 | 5/1997 | European Pat. Off. . |

(List continued on next page.)

OTHER PUBLICATIONS

IEEE Recommended Practice For Maintenance, Testings, and Replacement of Large Lead Storage Batteries for Generating Stations and Substations, *The Institute of Electrical and Electronics Engineerings, Inc.,* ANSI/IEEE Std. 450–1987, 3/9/1987, pp. 7–15.

(List continued on next page.)

*Primary Examiner*—Adolf Deneke Berhane
*Assistant Examiner*—Gregory J. Toatley, Jr.
*Attorney, Agent, or Firm*—Westman, Champlin & Kelly, P.A.

[57] ABSTRACT

An apparatus for charging a battery includes a first electrical connection adapted to connect to a positive terminal of the battery and a second electrical connector adapted to connect to a negative terminal of the battery. An electrical charging source couples to the first and second electrical connectors to charge the battery. Voltage measurement circuitry couples to the first and second electrical connectors and responsively provides a voltage output related to voltage across the battery. Current measurement circuitry also couples to the first and second electrical connectors and responsively provides a current output related to electrical current through the battery. State of charge measurement circuitry responsively provides a state of charge output as a function of the voltage output and the current output.

101 Claims, 5 Drawing Sheets

U.S. PATENT DOCUMENTS

| | | | |
|---|---|---|---|
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,390,282 | 6/1983 | Converse et al. | 320/153 |
| 4,392,101 | 7/1983 | Saar et al. | 320/20 |
| 4,396,880 | 8/1983 | Windebank | 320/156 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,816,768 | 3/1989 | Champlin | 324/428 |
| 4,820,966 | 4/1989 | Fridman | 320/32 |
| 4,825,170 | 4/1989 | Champlin | 324/426 |
| 4,849,700 | 7/1989 | Morioka et al. | 324/427 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,931,738 | 6/1990 | MacIntyre et al. | 324/435 |
| 4,947,124 | 8/1990 | Hauser | 324/430 |
| 4,956,597 | 9/1990 | Heavey et al. | 320/14 |
| 4,968,941 | 11/1990 | Rogers | 324/428 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,248 | 9/1992 | Alexandres et al. | 324/428 |
| 5,170,124 | 12/1992 | Blair et al. | 324/434 |
| 5,204,611 | 4/1993 | Nor et al. | 320/21 |
| 5,214,385 | 5/1993 | Gabriel et al. | 324/434 |
| 5,241,275 | 8/1993 | Fang | 324/430 |
| 5,254,952 | 10/1993 | Salley et al. | 324/430 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/106 |
| 5,302,902 | 4/1994 | Groehl | 324/434 |
| 5,331,268 | 7/1994 | Patino et al. | 320/20 |
| 5,336,993 | 8/1994 | Thomas et al. | 324/158.1 |
| 5,343,380 | 8/1994 | Champlin | 363/46 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,426,371 | 6/1995 | Salley et al. | 324/429 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,457,377 | 10/1995 | Jonsson | 320/5 |
| 5,485,090 | 1/1996 | Stephens | 324/433 |
| 5,488,300 | 1/1996 | Koenck et al. | 320/43 |
| 5,519,383 | 5/1996 | De La Rosa | 340/636 |
| 5,528,148 | 6/1996 | Rogers | 324/426 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,585,728 | 12/1996 | Champlin | 324/427 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,717,336 | 2/1998 | Basell et al. | 324/430 |
| 5,757,192 | 5/1998 | McShane et al. | 324/427 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,821,756 | 10/1998 | McShane et al. | 324/430 |
| 5,831,435 | 11/1998 | Troy | 324/426 |
| 5,872,433 | 2/1999 | Williamson | 320/139 |
| 5,914,605 | 6/1999 | Bertness | 324/430 |
| 5,945,829 | 8/1999 | Bertness | 324/430 |

FOREIGN PATENT DOCUMENTS

| | | |
|---|---|---|
| 29 26 716 B1 | 4/1981 | Germany . |
| 59-17892 | 1/1984 | Japan . |
| 59-17893 | 1/1984 | Japan . |
| 59-17894 | 1/1984 | Japan . |
| 59017894 | 1/1984 | Japan . |
| 60-225078 | 11/1985 | Japan . |
| 03274479 | 12/1991 | Japan . |
| 03282276 | 12/1991 | Japan . |
| 04131779 | 5/1992 | Japan . |
| 04372536 | 12/1992 | Japan . |
| 5216550 | 8/1993 | Japan . |
| 2 088 159 | 6/1982 | United Kingdom . |
| WO 93/22666 | 11/1993 | WIPO . |
| WO 98/58270 | 12/1998 | WIPO . |

OTHER PUBLICATIONS

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

"Electrochemical Impedance Spectroscopy in Battery Development and Testing", *Batteries International*, Apr. 1997, pp. 59 and 62–63.

"Determining The End of Battery Life ", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

"Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

METHOD AND APPARATUS FOR CHARGING A BATTERY

BACKGROUND OF THE INVENTION

The present invention relates to rechargeable storage batteries. More specifically, the present invention relates to battery chargers of the type used to charge such batteries.

Chemical batteries which create electricity from chemical reactions have been known for many years. Such batteries are becoming increasing important and have found uses throughout industry. These uses include automobiles, UPS systems, etc.

One advantage of chemical batteries, such as lead acid storage batteries, is that they can be charged and their chemical process reversed by forcing electricity through the battery. Charging systems are widely known in the art and are widely available in the consumer market.

One of the most common techniques for recharging storage batteries is simply placing a voltage source across the battery having a voltage which is greater than the battery voltage. The voltage difference will cause a charging current to flow through the battery causing a reversal of the chemical reaction. The charging current decreases as the voltage difference between the charging voltage and the battery voltage decreases. Typically, the charging voltage is selected to be greater than the nominal battery voltage in order to cause a slight overcharge of the battery. The battery is deemed to be "charged" when the battery will accept no additional current. Frequently, this is through a simple visual inspection of an amp meter on the battery charger by the user of the battery charger. The battery charger may then be switched off.

However, such a simple technique for recharging a battery, although inexpensive, does not provide optimum battery charging and provides very little information about the battery itself. The device does not permit optimal rapid charging of the battery and may lead to excessive overcharging of the battery that can permanently damage the battery and even lead to boiling of the battery electrochemicals causing an unsafe environment. On the other hand, undercharging of a battery results in a battery that is not capable of providing its full potential output. These problems are exacerbated in situations where the battery is rapidly charged using large charging currents.

U.S. Pat. No. 4,956,597, issued Sep. 11, 1990 to Heavey et al. and is assigned to American Monarch Corporation, and entitled "METHOD AND APPARATUS FOR CHARGING BATTERIES" describes one technique in which battery voltage is monitored in an attempt to determine when a battery is fully charged. Another example is shown in U.S. Pat. No. 5,642,031, entitled BATTERY RECHARGING SYSTEM WITH STATE OF CHARGE DETECTION THAT INITIALLY DETECTS WHETHER A BATTERY TO BE CHARGED IS ALREADY AT OR NEAR FULL CHARGE TO PREVENT OVERCHARGING, issued Jun. 24, 1997 to Brotto. The Brotto patent describes a technique in which the charging current is periodically pulsed and the voltage decay is monitored.

SUMMARY OF THE INVENTION

An apparatus for charging a battery includes a first electrical connection adapted to connect to a positive terminal of the battery and a second electrical connector adapted to connect to a negative terminal of the battery. An electrical charging source couples to the first and second electrical connectors to charge the battery. Voltage measurement circuitry couples to the first and second electrical connectors and responsively provides a voltage output related to voltage across the battery. Current measurement circuitry also couples to the first and second electrical connectors and responsively provides a current output related to electrical current through the battery. State of charge measurement circuitry responsively provides a state of charge output as a function of the voltage output and the current output. One aspect of the invention includes a state of charge output which increases as impedance decreases (and decreases as admittance increases) as determined by the voltage and current outputs. Another aspect of the invention includes battery rating storage circuitry which stores a rating related to the battery in a fully charged condition and the state of charge output is a function of a measured state of charge and the battery rating. This may be expressed, for example, as a percentage charge.

DETAILED DESCRIPTION OF THE PREFERRED EMBODIMENTS

The present invention provides an apparatus for charging a battery which is also capable of monitoring the condition of the battery. Such monitoring can be used to provide information to an operator, or to provide feedback to control the charging. The invention uses the charging current and voltage themselves to advantageously determine battery condition. Thus, a battery charger in accordance with the present invention is capable of determining the status of the battery, making advanced decisions about charging the battery and selecting a particular charging profile used in such charging.

Figure 1:
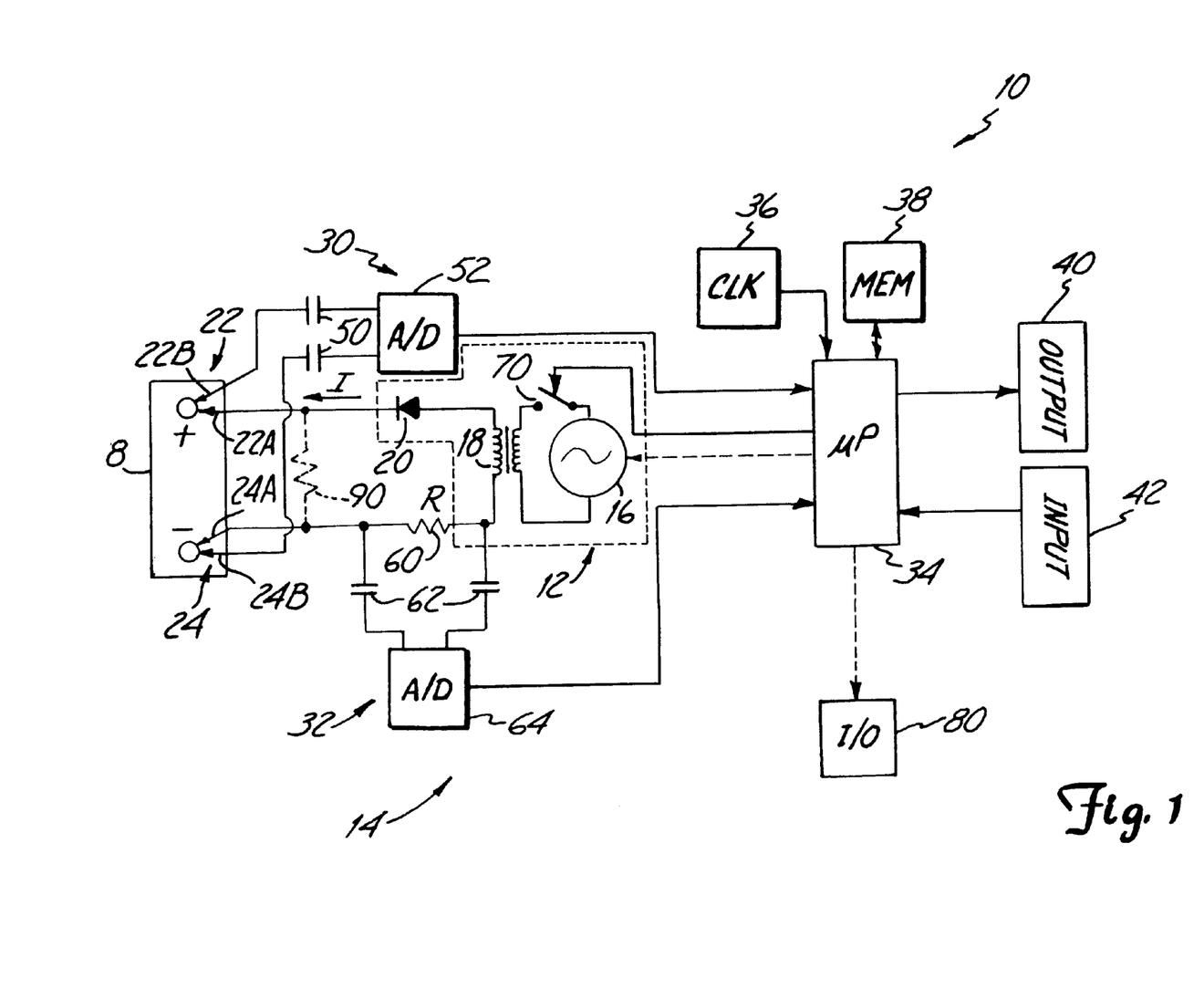
FIG. 1 is a simplified block diagram of a battery charging system in accordance with the present invention.

FIG. 1 is a simplified block diagram of a battery charging system 10 in accordance with the present invention coupled to storage battery 8. System 10 includes battery charger circuitry and test circuitry 14. Battery charge circuitry 12 generally includes AC source 16, transformer 18 and rectifier 20. System 10 couples to battery 8 through electrical connection 22 which couples to the positive terminal of battery 8 and electrical connection 24 which couples to the negative terminal of battery 8. In one preferred embodiment, a four point (or Kelvin) connection technique is used in which battery charge circuitry 12 couples to battery 8 through electrical connections 22A and 24B while battery testing circuitry 14 couples to battery 8 through electrical connections 22A and 24B.

Battery testing circuitry 14 includes voltage measurement circuitry 30 and current measurement circuitry 32 which provide outputs to microprocessor 34. Microprocessor 34 also couples to a system clock 36 and memory 38 which is used to store information and programming instructions. In the embodiment of the invention shown in FIG. 1, microprocessor 34 also couples to user output circuitry 40 and user input circuitry 42.

Voltage measurement circuitry 30 includes capacitors 50 which couple analog to digital converter 52 to battery 8 through electrical connections 22B and 24B. Any type of coupling mechanism may be used for element 50 and capacitors are merely shown as one preferred embodiment. Further, the device may also couple to DC signals. Current measurement circuitry 32 includes a shunt resistor (R) 60 and coupling capacitors 62. Shunt resistor 60 is coupled in series with battery charging circuitry 12. Other current measurement techniques are within the scope of the invention including Hall-Effect sensors, magnetic or inductive coupling, etc. An analog to digital converter 64 is connected across shunt resistor 60 by capacitors 62 such that the voltage provided to analog to digital converter 64 is proportional to a current I flowing through battery 8 due to charging circuitry 12. Analog to digital converter 64 provides a digitized output representative of this current to microprocessor 34.

During operation, AC source 16 is coupled to battery 8 through transformer 18 and rectifier 20. Rectifier 20 provides half way rectification such that current I has a non-zero DC value. Of course, full wave rectification or other AC sources may also be used. Analog to digital converter 64 provides a digitized output to microprocessor 34 which is representative of current I flowing through battery 8. Similarly, analog to digital converter 52 provides a digitized output representative of the voltage across the positive and negative terminals of battery 8. Analog to digital converters 52 and 64 are capacitively coupled to battery 8 such that they measure the AC components of the charging signal.

Microprocessor 34 determines the conductance of battery 8 based upon the digitized current and voltage information provided by analog to digital converters 64 and 52, respectively. Microprocessor 34 calculates the conductance of battery 8 as follows:

$$\text{Conductance} = G = I/V, \quad \text{Eq. 1}$$

where I is the charging current and V is the charging voltage across battery 8. Note that in one preferred embodiment the Kelvin connections allow more accurate voltage determination because these connections do not carry substantial current to cause a resultant drop in the voltage measured.

In accordance with the present invention, the battery conductance is used to monitor charging of battery 8. Specifically, it has been discovered that as a battery is charged the conductance of the battery rises which can be used as feedback to the charger. This rise in conductance can be monitored in microprocessor 34 to determine when the battery has been fully charged. For example, if the rate of the rise in conductance slowly decreases, such that the conductance reaches a substantially constant value, microprocessor 34 determines that battery 8 is fully charged and disconnect charging circuitry 12 using switch 70. Further, in one aspect of the present invention, microprocessor 34 responsively controls the rate of charge by adjusting AC source 16 to reduce the likelihood that battery 8 is damaged by significant overcharge.

Figure 2:
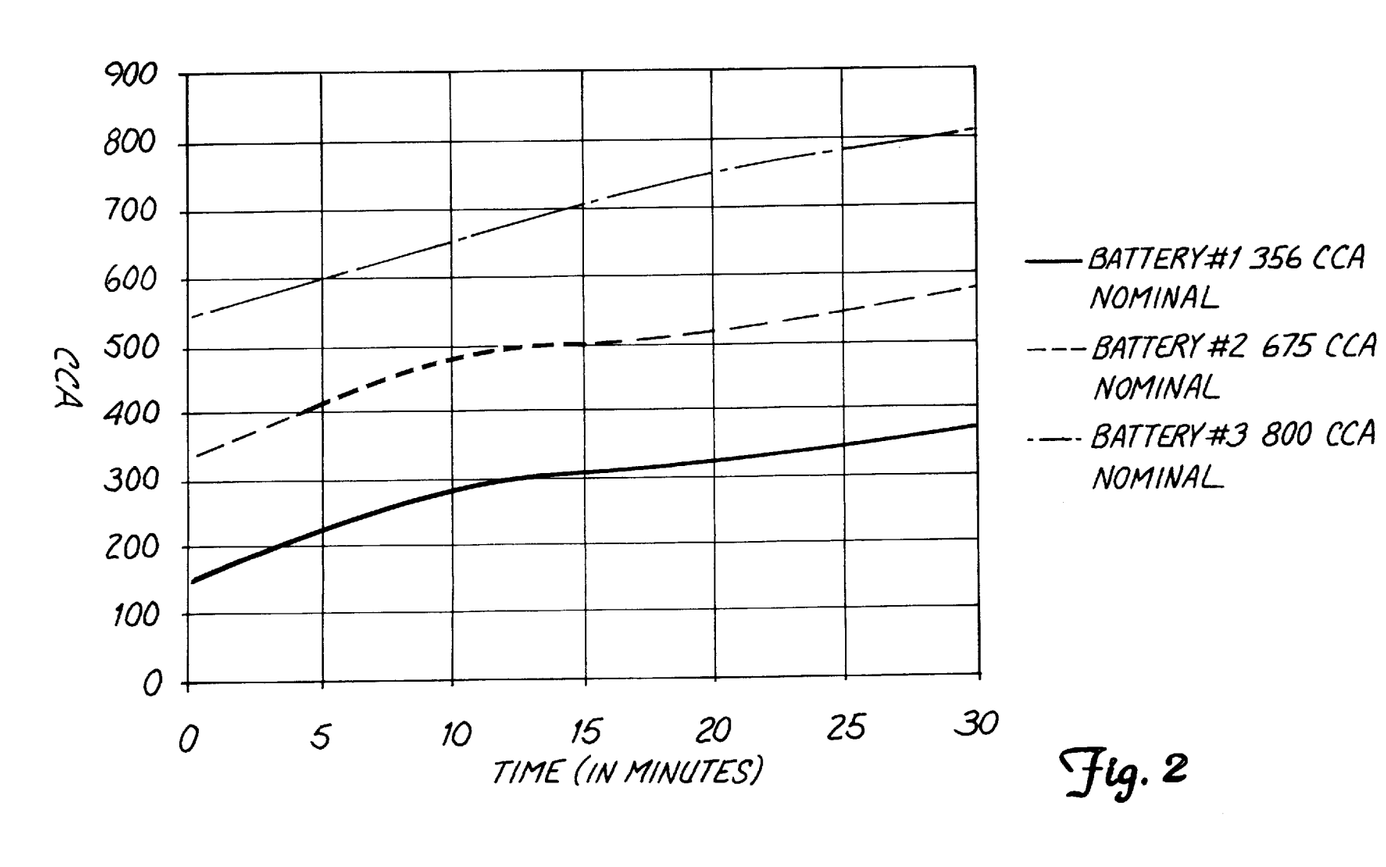
FIG. 2 is a graph of CCA versus time.

Furthermore, microprocessor 34 can calculate cold cranking amps (CCA) of battery 8 using the formula:

$$CCCA = K \cdot G \quad \text{Eq. 2}$$

where K is constant which may be selected for a specific battery and G is given in Equation 1. FIG. 2 is a graph of CCA versus time in minutes for three different batteries having three different nominal CCA ratings. This particular graph shows that after about 25 to 30 minutes, each battery has reached its nominal CCA rating.

Figure 3:
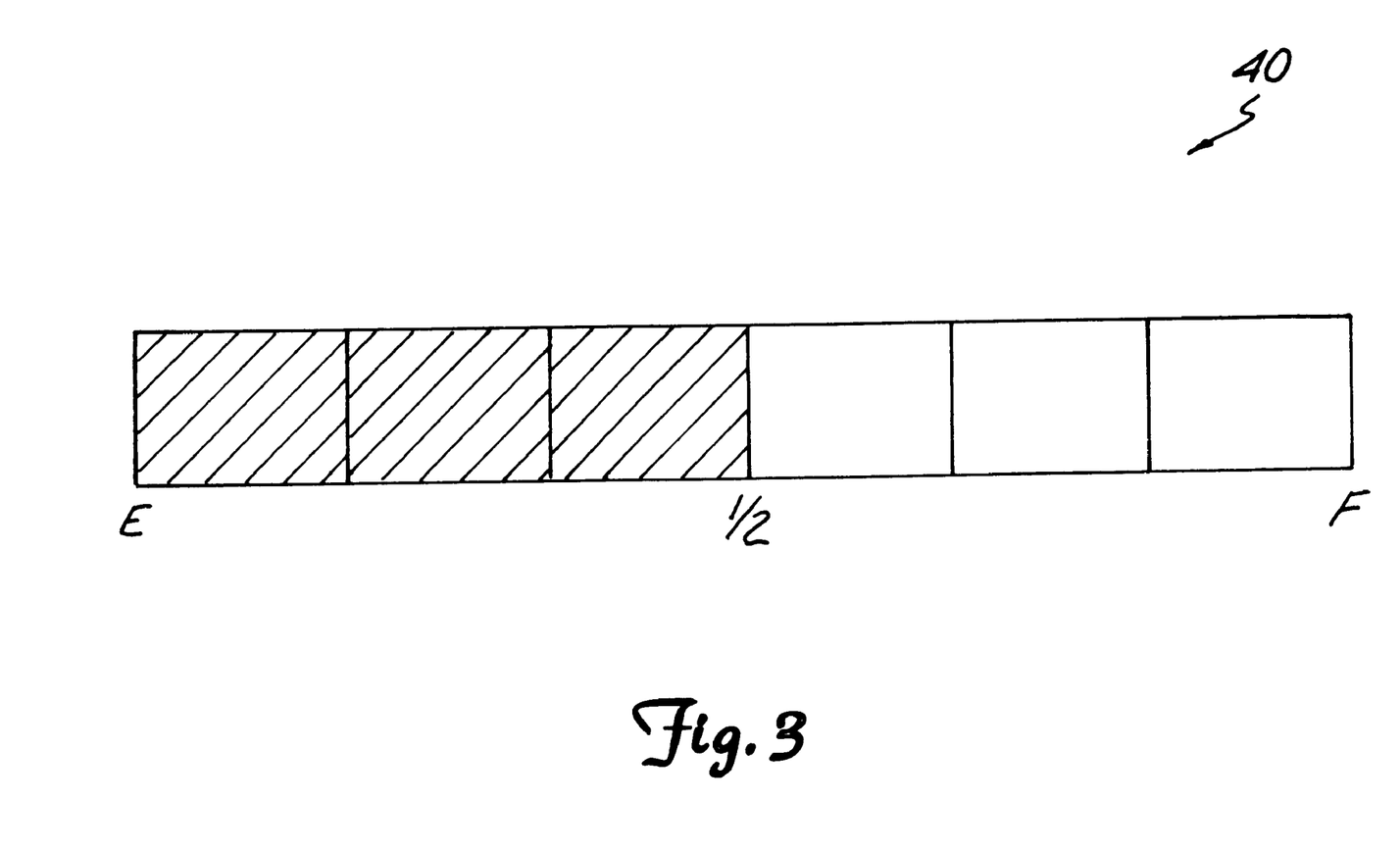
FIG. 3 shows an output display in accordance with one embodiment of the present invention.

One aspect of the invention includes storing information in microprocessor 34 or memory 38 which relates to battery 8. For example, this information could be the battery's nominal CCA rating as input through input 42 by an operator. Further, the make and model of the battery may be input by an operator through input 42 and information related to that specific battery type recovered from memory 38. In general, the rating of the battery may be input in the form of CCA, amp hours, RC, JIS number, stock number, battery construction or chemistry, etc. For example, if a nominal or reference conductance ($G_{REFERENCE}$) is stored in memory, a relative conductance determination can be made by microprocessor 34 using the equation:

$$\text{Relative Conductance}(\%) = \frac{G_{measured}}{G_{reference}} \times 100, \quad \text{Eq. 3}$$

where $G_{measured}$ is the battery conductance in accordance with Equation 1. Generally, this reference conductance is determined based upon type and characteristics of battery 8. This technique is described in U.S. Pat. No. 5,140,269, entitled ELECTRONIC TESTER FOR ASSESSING BATTERY/CELL CAPACITY, issued Aug. 18, 1992 to Champlin. This may be converted into a display for output on output 40 such that an operator may monitor the charging of battery 8. For example, FIG. 3 shows one embodiment of output 40 in which a bar graph is provided with indications for "empty" and "full." In the embodiment shown in FIG. 3, a half reading "full" is shown. This may be implemented through an LED display, for example. Other examples of desirable outputs include outputs which appear as a gauge or other visual indication of the battery condition. Other types of outputs include outputs indicating the recovering of amp hours, state of charge, reserve capacity, time to full charge or run time remaining. This may be shown in percentages, numerically, graphically, etc.

Figure 4:
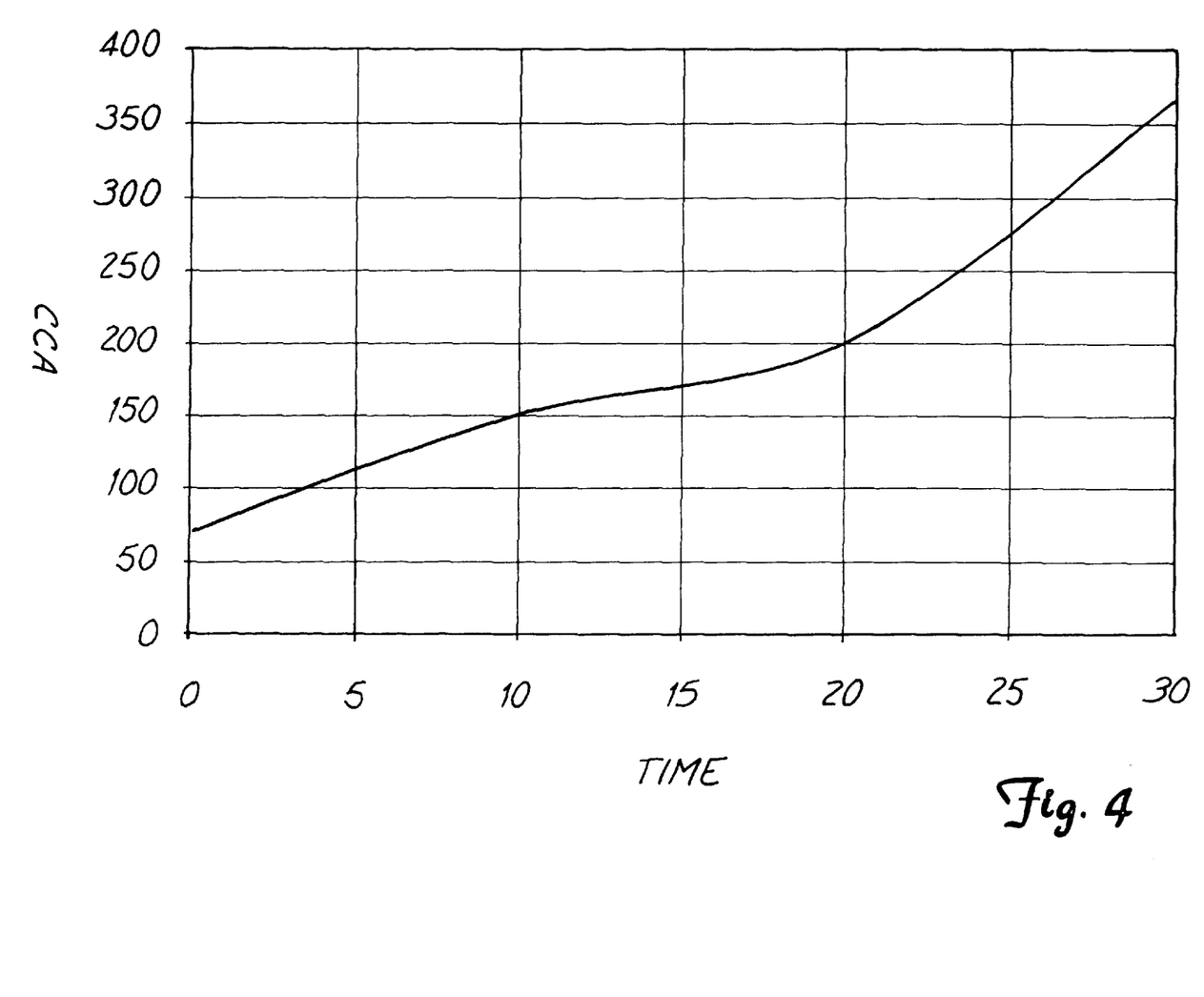
FIG. 4 is a graph of CCA versus time for a battery with a bad cell.
Figure 5:
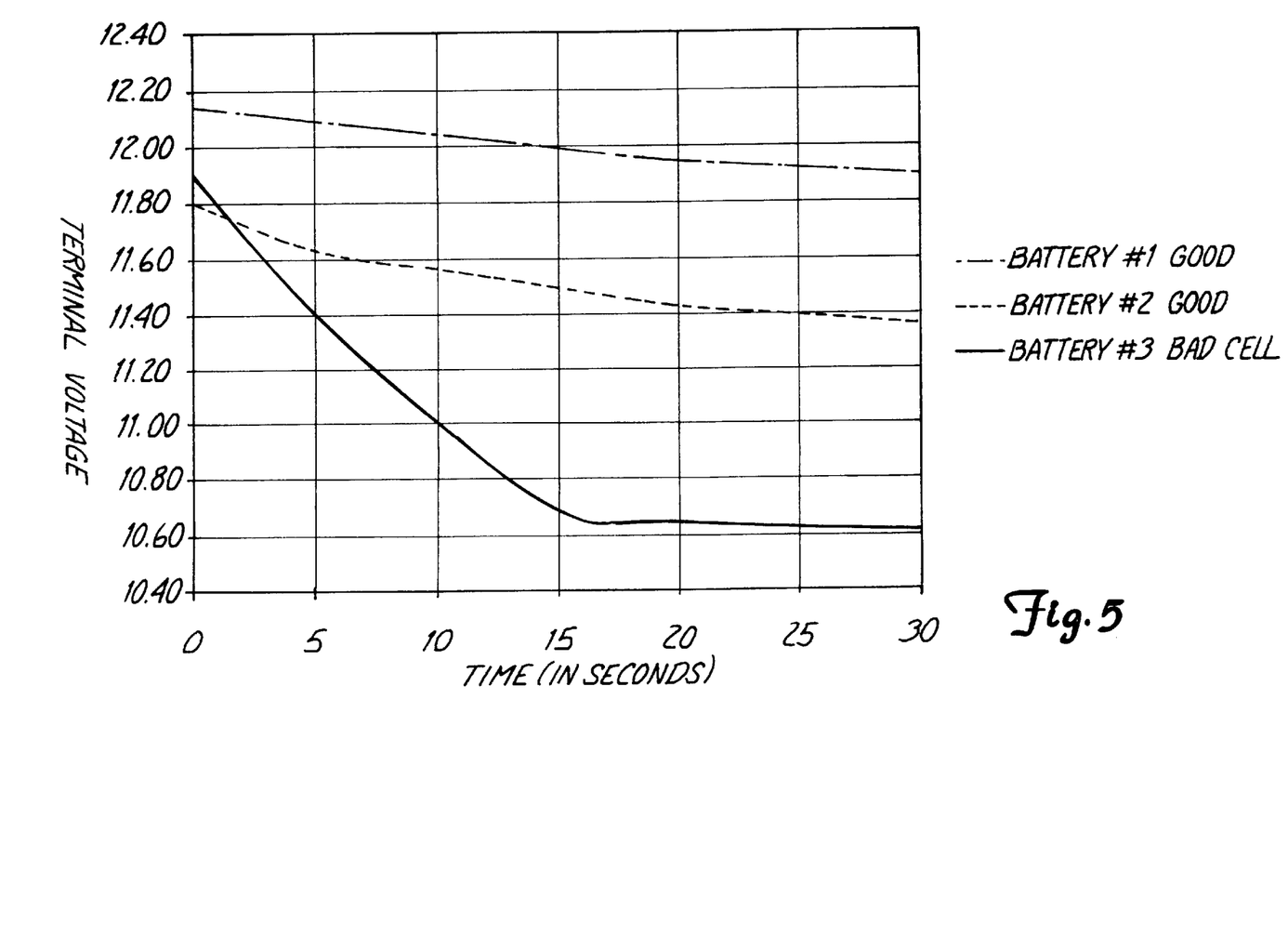
FIG. 5 is a graph of terminal voltage versus time for three batteries under a load test.

One general aspect of the present invention includes a technique for providing feedback control of a battery charger where the feedback control is a function of charging voltage and charging current. In one embodiment, bad cells or shorted cells are detected when the rate of change of the conductance is greater than a predetermined threshold. For example, FIG. 4 is a graph of CCA versus time for a battery (nominal conductance of 500 CCA) being charged in accordance with the invention which developed a bad cell during testing. The graph of FIG. 4 shows an abnormal change in conductance in comparison to the graphs of FIG. 2. This can be used to control the charging rate, or to stop the charging rate and give a fault indication using output 40. Further, an initial load test may be applied to the battery using load resistance 90 to determine if there is a bad cell by observing a resultant decline in voltage versus time using voltage measurement circuitry 30. This is illustrated in the graph of FIG. 5 which shows battery terminal voltage versus time for two good batteries and one battery with a bad cell. Further, other diagnostics may be performed such as those described in U.S. Pat. No. 5,574,355, entitled METHOD AND APPARATUS FOR DETECTION AND CONTROL OF THERMAL RUNAWAY IN A BATTERY UNDER CHARGE, issued Nov. 12, 1996 to McShane et al.

The present invention advantageously uses the charging current and voltage to determine the condition of the battery. This allows for continuous testing during battery charging and the battery charger does not need to be taken off line. Further, the measurement is not adversely affected by electrical noise in the system.

Another aspect of the present invention includes an I/O port or link 80 which is adapted to be coupled to an external device, such as an external battery tester, printer, storage device, automotive analysis device, etc. This may be a physical link, or, in one embodiment, this I/O link is through an infrared (IR), radio frequency (RF), or ultrasonic connection such that a physical link between the two units is not necessary. For example, the results from a previously performed battery test can be supplied to system 10 by a separate battery tester, whereby the initial condition of battery 8 is used during charging. Similarly, an external or separate device can communicate information such as the model number or type of battery being charged.

The present invention advantageously uses a Kelvin connection in which the electrical connection to the battery includes two connections for charging and two connections for a separate voltage measurement.

Additionally, during charging, the rate of increase of the voltage may be selectively monitored to determine charging efficiency and other characteristics of the battery.

One type of output that can be provided on output 40 includes various types of auditing codes as those set forth in co-pending application Ser. No. 08/681,730, entitled "METHOD AND APPARATUS FOR AUDITING A BATTERY TEST", filed Jul. 29, 1996 which is commonly assigned with the present application. Additional codes include the sequence code which can indicate the order in which tests were made on an individual battery tester or a time code which indicates the date and time at which a test was made.

In general, although the formulas and techniques set forth herein discuss determination of conductance, the present invention may also be applied to impedance measurements, resistance measurements or admittance measurements of the storage battery. Further, although a microprocessor and digital circuitry is disclosed herein, the present invention may also be implemented in analog circuitry. In general, various techniques for measuring battery conductance are shown in a number of patents including, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 4,322,685, issued Mar. 30, 1982, entitled AUTOMATIC BATTERY ANALYZER INCLUDING APPARATUS FOR DETERMINING PRESENCE OF SINGLE BAD CELL; U.S. Pat. No. 5,343,380, issued Aug. 30, 1994, entitled "METHOD AND APPARATUS FOR SUPPRESSING TIME VARYING SIGNALS IN BATTERIES UNDERGOING CHARGING OR DISCHARGING"; U.S. Pat. No. 5,572,136, issued Nov. 5, 1996, entitled "ELECTRONIC BATTERY TESTER WITH AUTOMATIC COMPENSATION FOR LOW STATE-OF-CHARGE"; U.S. Pat. No. 5,574,355, issued Nov. 12, 1996, entitled "METHOD AND APPARATUS FOR DETECTION AND CONTROL OF THERMAL RUNAWAY IN A BATTERY UNDER CHARGE"; U.S. Pat. No. 5,585,728, issued Dec. 17, 1996, entitled "ELECTRONIC BATTERY TESTER WITH AUTOMATIC COMPENSATION FOR LOW STATE-OF-CHARGE"; U.S. Pat. No. 5,598,098, issued Jan. 28, 1997, entitled "ELECTRONIC BATTERY TESTER WITH VERY HIGH NOISE IMMUNITY"; and U.S. Pat. No. 5,592,093, issued Jan. 7, 1997, entitled "ELECTRONIC BATTERY TESTING DEVICE LOOSE TERMINAL CONNECTION DETECTION VIA A COMPARISON CIRCUIT".

Although the present invention has been described with reference to preferred embodiments, workers skilled in the art will recognize that changes may be made in form and detail without departing from the spirit and scope of the invention. The various voltages and currents measured herein are set forth as alternating signals and their measurements may be through RMS values, peak-to-peak measurements, etc. However, other techniques may be employed and DC signals may also be monitored. In a typical battery charger, the AC component of the charging signal is related to the line frequency and thus, in the United States, is typically 60 Hz or 120 Hz. However, other frequencies may also be employed. Further, the charge signal may be a stepped DC signal and the voltage and current measurement circuitry responsive to step DC signals. In general, the invention determines battery and/or charging conditions based upon a ratio of charging voltage and charging current.

What is claimed is:

1. An apparatus for charging a lead acid storage battery, comprising:
   a first electrical connector adapted to connect to a positive terminal of the battery;
   a second electrical connector adapted to connect to a negative terminal of the battery;
   an electrical charging source providing a charge signal to the first and second connectors, the charge signal sufficiently large to charge the battery, wherein the charge signal includes an AC signal component;
   voltage measurement circuitry coupled to the first and second electrical connectors responsively providing sensed voltage output related to the AC signal component of the charge signal;
   current measurement circuitry coupled to the first electrical connector responsively providing a sensed current output related to the AC signal component of the charge signal; and
   state of charge measurement circuitry responsively providing a state of charge output as a function of a parameter of the lead acid storage determined as a ratio of the sensed voltage output and the sensed current output, the state of charge output related to the amount the battery is charged.

2. The apparatus of claim 1 wherein the state of charge output increases as battery impedance decreases and increases as battery admittance increases based upon the sensed voltage and current outputs.

3. The apparatus of claim 1 including battery rating storage circuitry storing a rating related to the battery in a fully charged condition and wherein the state of charge output is a function of measured state of charge and the stored battery rating.

4. The apparatus of claim 3 wherein the state of charge output is a percentage.

5. The apparatus of claim 1 wherein the electrical charging source provides a rectified signal to charge the battery.

6. The apparatus of claim 1 wherein the current measurement circuitry includes a resistor placed in series with the electrical charging source to generate a voltage drop thereacross.

7. The apparatus of claim 1 wherein the current measurement circuitry includes a Hall-Effect sensor which provides the sensed current output as a voltage.

8. The apparatus of claim 1 wherein the current measurement circuitry includes a magnetic pickup which provides the sensed current output as a voltage.

9. The apparatus of claim 1 wherein the state of charge output is a function of the sensed current output divided by the sensed voltage output.

10. The apparatus of claim 1 wherein the state of charge measurement circuitry comprises a microprocessor.

11. The apparatus of claim 1 wherein the charge signal from the electrical charging source is responsive to the state of charge output from the state of charge measurement circuitry.

12. The apparatus of claim 11 wherein the charge signal is reduced as the state of charge of the battery increases.

13. The apparatus of claim 3 including input circuitry for receiving an input related to battery rating for storage in the battery rating storage circuitry.

14. The apparatus of claim 13 wherein the input is a user input.

15. The apparatus of claim 14 wherein the user input is selected from the group consisting of battery make, battery model, battery type, battery part number and battery rating.

16. The apparatus of claim 1 including a load resistance for performing a load test on the battery.

17. The apparatus of claim 1 wherein the charge signal includes an AC component.

18. The apparatus of claim 17 wherein the voltage and current measurement circuits are responsive to AC signals.

19. The apparatus of claim 18 wherein the voltage and current measurement circuits measure RMS.

20. The apparatus of claim 18 wherein the voltage and current measurement circuits measure peak-to-peak.

21. The apparatus of claim 1 wherein the charge signal includes a stepped DC component.

22. The apparatus of claim 21 wherein the voltage and current circuits are responsive to step changes in DC levels.

23. The apparatus of claim 1 wherein the state of charge measurement circuitry provides an output indicative of a bad cell in the battery in response to the sensed voltage and current outputs.

24. The apparatus of claim 1 including a parameter input and the state of charge output is further a function of a parameter input.

25. The apparatus of claim 24 wherein the input is received over a non-physical link.

26. The apparatus of claim 25 wherein the non-physical link is selected from the group consisting of IR, RF, and ultrasonic.

27. The apparatus of claim 3 wherein the battery rating storage circuitry stores a CCA rating.

28. The apparatus of claim 3 wherein the battery rating storage circuitry stores a JIS rating.

29. The apparatus of claim 3 wherein the battery rating storage circuitry stores a battery stock number.

30. The apparatus of claim 3 wherein the battery rating storage circuitry stores battery construction information.

31. The apparatus of claim 1 including a visual display to display the state of charge output.

32. The apparatus of claim 31 wherein the display provides empty and full indications.

33. The apparatus of claim 1 wherein the state of charge output is related to a battery condition selected from the group consisting of recovery of amp hours, reserve capacity, time to full charge and run charge remaining.

34. The apparatus of claim 1 including application of a resistive load to provide a battery load test.

35. The apparatus of claim 25 wherein the input is provided from a battery tester.

36. The apparatus of claim 1 including an I/O port for coupling to an external device.

37. The apparatus of claim 36 wherein the external device comprises a printer.

38. The apparatus of claim 36 wherein the external device comprises a storage device.

39. The apparatus of claim 36 wherein the external device comprises an automotive analysis device.

40. The apparatus of claim 36 wherein the external device comprises a battery tester.

41. The apparatus of claim 36 wherein the I/O port comprises a non-physical link.

42. The apparatus of claim 41 wherein the link comprises an infrared link.

43. The apparatus of claim 41 wherein the link comprises a radio frequency link.

44. The apparatus of claim 41 wherein the link comprises an ultrasonic link.

45. The apparatus of claim 36 wherein the I/O port receives battery model information from an external device.

46. The apparatus of claim 36 wherein the I/O port receives battery type information from an external device.

47. The apparatus of claim 1 including output circuitry adapted to provide an audit code.

48. The apparatus of claim 47 wherein the audit code includes a sequence code.

49. The apparatus of claim 47 wherein the audit code includes time information.

50. The apparatus of claim 47 wherein the audit code includes date information.

51. The apparatus of claim 1 wherein the state of charge output is a function of battery resistance.

52. The apparatus of claim 1 wherein the state of charge output is a function of battery impedance.

53. The apparatus of claim 1 wherein the state of charge output is a function of battery admittance.

54. The apparatus of claim 1 wherein the charge signal is a function of a battery charge profile.

55. The apparatus of claim 54 wherein the charge signal is further a function of the state of charge output.

56. An apparatus for charging a lead acid storage battery, comprising:

a first electrical connector adapted to connect to a positive terminal of the battery;

a second electrical connector adapted to connect to a negative terminal of the battery;

an electrical charging source adapted to provide a charge signal to the first and second connectors, the charge signal sufficiently large to charge the battery, wherein the charge signal includes an AC signal component;

a memory adapted to contain stored information related to the battery;

an input adapted to receive input information related to the battery; and a microprocessor coupled to the electrical charging source adapted to responsively control the charge signal as a function of the input information, the AC signal component of the charge signal and the stored information.

57. The apparatus of claim 56 including measurement circuitry adapted to measure a parameter of the battery and wherein the microprocessor controls the charge signal further as a function of the parameter.

58. The apparatus of claim 56 including:
voltage measurement circuitry coupled to the first and second electrical connectors adapted to responsively provide a sensed voltage output related to the AC signal component of the charge signal; and
current measurement circuitry coupled to the first and second electrical connectors adapted to responsively provide a sensed current output related to the AC signal component of the charge signal.

59. The apparatus of claim 58 including:
state of charge measurement circuitry adapted to responsively provide a state of charge output as a function of the sensed voltage output and the sensed current output.

60. The apparatus of claim 59 wherein the microprocessor further controls the charge signal in response to the state of charge output.

61. The apparatus of claim 59 wherein the stored information includes circuitry storing a stored battery rating related to the battery in a fully charged condition and wherein the state of charge output is a function of measured state of charge and the stored battery rating.

62. The apparatus of claim 61 wherein the state of charge output is a percentage.

63. The apparatus of claim 56 wherein the input information comprises battery rating.

64. The apparatus of claim 56 wherein the input information is selected from the group consisting of battery make, battery model, battery type, battery part number and battery rating.

65. The apparatus of claim 56 wherein the input is received from a non-physical link.

66. The apparatus of claim 65 wherein the non-physical link is selected from the group consisting of infrared, radio frequency, and ultrasonic.

67. The apparatus of claim 56 wherein the stored information includes a CCA rating.

68. The apparatus of claim 56 wherein the stored information includes a JIS rating.

69. The apparatus of claim 56 wherein the stored information includes a battery stock number.

70. The apparatus of claim 56 wherein the stored information includes battery construction information.

71. The apparatus of claim 56 including a resistive load adapted to couple to the battery to provide a battery load test.

72. The apparatus of claim 56 including an I/O port for coupling to an external device.

73. The apparatus of claim 72 wherein the external device comprises a printer.

74. The apparatus of claim 72 wherein the external device comprises a storage device.

75. The apparatus of claim 72 wherein the external device comprises an automotive analysis device.

76. The apparatus of claim 72 wherein the external device comprises a battery tester.

77. The apparatus of claim 72 wherein the I/O port comprises a non-physical link.

78. The apparatus of claim 77 wherein the link comprises an infrared link.

79. The apparatus of claim 77 wherein the link comprises a radio frequency link.

80. The apparatus of claim 77 wherein the link comprises an ultrasonic link.

81. The apparatus of claim 72 wherein the I/O port receives battery model information from an external device.

82. The apparatus of claim 56 including output circuitry provided an audit code.

83. The apparatus of claim 56 wherein the charge signal is further a function of a battery charge profile stored in the memory.

84. A method performed by an apparatus for charging a lead acid storage battery, comprising:
generating a charge signal having sufficient energy to charge the battery;
applying the charge signal to the storage battery to charge the battery, wherein the charge signal includes an AC signal component;
sensing a voltage related to the AC signal component of the charge signal;
sensing a current related to the AC signal component of the charge signal; and
determining state of charge of the battery as a function of a ratio of the sensed voltage and sensed current.

85. The method of claim 84 including controlling the charge signal in response to the state of charge of the battery.

86. The method of claim 84 including displaying the state of charge of the battery.

87. The method of claim 84 wherein the charge signal is function of a battery charge profile.

88. The method of claim 84 including performing a load test on the storage battery.

89. The method of claim 84 including receiving an input related to a battery rating of the storage battery.

90. The method of claim 84 including detecting a bad cell in the battery.

91. The method of claim 84 including receiving an input over a non-physical link.

92. The method of claim 84 including providing an output over a non-physical link.

93. The method of claim 84 including generating an audit code.

94. A method performed by an apparatus for charging a lead acid storage battery, comprising:
generating a charge signal having sufficient energy to charge the storage battery, wherein the charge signal includes an AC signal component;
applying a charge signal to the storage battery to charge the battery;
retrieving stored information related to the battery stored in a memory;
receiving input information related to the battery through an input; and
responsively controlling the charge signal as a function of the input information, the AC signal component of the charge signal and the stored information related to the battery.

95. The method of claim 94 including measuring a parameter of the battery and further controlling the charge signal as a function of the measured parameter.

96. The method of claim 95 wherein the parameter comprises state of charge of the storage battery.

97. The method of claim 96 wherein the state of charge is a function of a battery rating received in the step of receiving information.

98. The method of claim 94 wherein the information is received from a non-physical link.

99. The method of claim 98 wherein the non-physical link is selected from the group consisting of infrared, radio frequency and ultrasonic.

100. The method of claim 94 including providing an output to an external device.

101. The method of claim 94 including generating an audit code.

* * * * *

UNITED STATES PATENT AND TRADEMARK OFFICE
CERTIFICATE OF CORRECTION

PATENT NO. : 6,081,098
DATED : June 27, 2000
INVENTOR(S) : Kevin I. Bertness

It is certified that error appears in the above-identified patent and that said Letters Patent is hereby corrected as shown below:

Title page,
OTHER PUBLICATIONS, change "IEEE Recommended Practice For Maintenance, Testings, and Replacement of Large Lead Storage Batteries for Generating Stations and Substations, The Institute of Electrical and Electronics Engineerings, Inc., ANSI/IEEE Std. 450-1987, 3/9/1987, pp. 7-15." to -- IEEE Recommended Practice for Maintenance, Testings, and Replacement of Large Lead Storage Batteries for Generating Stations and Substations, The Institute of Electrical and Electronics Engineers, Inc., ANSI/IEEE Std. 450-1987, 3/9/1987, pp. 7-15. --

Column 3,
Eq. 2, change "$CCCA = K \cdot G$" to -- $CCA = K \cdot G$ --

Signed and Sealed this

Eighteenth Day of December, 2001

Attest:

JAMES E. ROGAN
*Attesting Officer*     *Director of the United States Patent and Trademark Office*